(12) United States Patent
Baumgartner et al.

(10) Patent No.: US 8,181,134 B2
(45) Date of Patent: May 15, 2012

(54) TECHNIQUES FOR PERFORMING CONDITIONAL SEQUENTIAL EQUIVALENCE CHECKING OF AN INTEGRATED CIRCUIT LOGIC DESIGN

(75) Inventors: Jason R. Baumgartner, Austin, TX (US); Michael L. Case, Pflugerville, TX (US); Hari Mony, Austin, TX (US); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 12/580,373

(22) Filed: Oct. 16, 2009

(65) Prior Publication Data

US 2011/0093824 A1    Apr. 21, 2011

(51) Int. Cl.
*G06F 17/50* (2006.01)
(52) U.S. Cl. ........ 716/107; 716/103; 716/104; 716/111; 703/16
(58) Field of Classification Search .................. 716/107, 716/103, 104, 111; 703/16
See application file for complete search history.

(56) References Cited

U.S. PATENT DOCUMENTS

| | | | | |
|---|---|---|---|---|
| 6,163,876 | A * | 12/2000 | Ashar et al. ................... | 716/107 |
| 6,321,184 | B1 * | 11/2001 | Baumgartner et al. ......... | 703/15 |
| 6,745,160 | B1 * | 6/2004 | Ashar et al. ..................... | 703/14 |
| 7,149,675 | B2 | 12/2006 | Hoskote et al. | |
| 7,240,311 | B2 | 7/2007 | Lai et al. | |
| 7,299,432 | B2 * | 11/2007 | Baumgartner et al. ....... | 716/104 |
| 7,350,166 | B2 * | 3/2008 | Baumgartner et al. ....... | 716/103 |
| 7,350,179 | B2 * | 3/2008 | Baumgartner et al. ....... | 716/104 |
| 7,367,002 | B2 * | 4/2008 | Baumgartner et al. ....... | 716/103 |
| 7,370,298 | B2 * | 5/2008 | Baumgartner et al. ....... | 716/104 |
| 7,373,618 | B1 | 5/2008 | Khoo et al. | |
| 7,383,166 | B2 * | 6/2008 | Ashar et al. ..................... | 703/14 |
| 7,437,690 | B2 * | 10/2008 | Baumgartner et al. ....... | 716/103 |
| 7,523,423 | B1 | 4/2009 | Koelbl et al. | |
| 7,689,943 | B2 * | 3/2010 | Baumgartner et al. ....... | 716/104 |
| 7,752,593 | B2 * | 7/2010 | Baumgartner et al. ....... | 716/104 |
| 7,765,514 | B2 * | 7/2010 | Baumgartner et al. ....... | 716/103 |
| 7,836,414 | B2 * | 11/2010 | Koelbl et al. .................. | 716/103 |
| 7,882,470 | B2 * | 2/2011 | Baumgartner et al. ....... | 716/106 |
| 7,913,205 | B2 * | 3/2011 | Baumgartner et al. ....... | 716/105 |
| 7,917,874 | B2 * | 3/2011 | Baumgartner et al. ....... | 716/105 |

(Continued)

OTHER PUBLICATIONS

Baumgartner, et al; "Optimal Constraint-Preserving Netlist Simplification"; IBM Corporation, Dept. of ECE, University of Texas at Austin; Mar. 2008.

(Continued)

*Primary Examiner* — Phallaka Kik
(74) *Attorney, Agent, or Firm* — Yudell Isidore Ng Russell PLLC

(57) ABSTRACT

A technique for conditional sequential equivalence checking of logic designs embodied in netlists includes creating an equivalence-checking netlist over a first netlist and a second netlist. The conditional sequential equivalence checking includes conditions under which equivalences of the first and second netlists are checked. The technique derives a set of candidate conditional equivalence invariants for each correlated gate in a correlated gate pair set and attempts to prove that each candidate conditional equivalence invariant in the set of candidate conditional equivalence invariants is accurate. The candidate conditional equivalence invariants that cannot be proven accurate are removed from the set of candidate conditional equivalence invariants. The candidate conditional equivalence invariants that have been proven accurate are recorded as a set of conditional equivalence invariants. Finally, the conditional sequential equivalence checking of the equivalence-checking netlist is completed using the set of conditional equivalence invariants that are recorded.

20 Claims, 4 Drawing Sheets

U.S. PATENT DOCUMENTS

| | | | |
|---|---|---|---|
| 8,015,521 B2* | 9/2011 | Moon | 716/107 |
| 8,042,075 B2* | 10/2011 | Baumgartner et al. | 716/103 |
| 2003/0172360 A1* | 9/2003 | Nystrom et al. | 716/1 |
| 2004/0148150 A1* | 7/2004 | Ashar et al. | 703/14 |
| 2005/0283744 A1* | 12/2005 | Mochizuki | 716/3 |
| 2005/0289486 A1* | 12/2005 | Caron et al. | 716/3 |
| 2006/0248481 A1* | 11/2006 | Baumgartner et al. | 716/2 |
| 2006/0248482 A1* | 11/2006 | Baumgartner et al. | 716/2 |
| 2006/0248483 A1* | 11/2006 | Baumgartner et al. | 716/2 |
| 2006/0248484 A1* | 11/2006 | Baumgartner et al. | 716/3 |
| 2006/0248494 A1* | 11/2006 | Baumgartner et al. | 716/18 |
| 2007/0106963 A1* | 5/2007 | Baumgartner et al. | 716/2 |
| 2007/0220461 A1* | 9/2007 | Baumgartner et al. | 716/5 |
| 2008/0092104 A1* | 4/2008 | Baumgartner et al. | 716/18 |
| 2008/0092105 A1* | 4/2008 | Baumgartner et al. | 716/18 |
| 2008/0104560 A1* | 5/2008 | Baumgartner et al. | 716/5 |
| 2008/0109769 A1* | 5/2008 | Baumgartner et al. | 716/3 |
| 2008/0109774 A1* | 5/2008 | Baumgartner et al. | 716/5 |
| 2008/0109781 A1* | 5/2008 | Baumgartner et al. | 716/12 |
| 2008/0209287 A1 | 8/2008 | Baumgartner et al. | |
| 2008/0209370 A1* | 8/2008 | Koelbl et al. | 716/5 |
| 2008/0235637 A1* | 9/2008 | Baumgartner et al. | 716/4 |
| 2008/0276144 A1 | 11/2008 | Huben et al. | |
| 2008/0288901 A1 | 11/2008 | Barowski et al. | |
| 2009/0094563 A1 | 4/2009 | Baumgartner et al. | |
| 2009/0138837 A1 | 5/2009 | Baumgartner et al. | |
| 2009/0241074 A1 | 9/2009 | Tanimoto | |
| 2009/0300563 A1* | 12/2009 | Moon | 716/5 |
| 2010/0251197 A1* | 9/2010 | Baumgartner et al. | 716/6 |
| 2010/0269077 A1* | 10/2010 | Baumgartner et al. | 716/5 |
| 2010/0293513 A1* | 11/2010 | Baumgartner et al. | 716/3 |

OTHER PUBLICATIONS

Lu, et al; "SEChecker: A Sequential Equivalence Checking Framework Based on Kth Invariants"; IEEE Transactions on Very Large Scale Integration (VLSI) Systems; vol. 17; No. 6; Jun. 2009; pp. 733-746.

Wedler, et al; "Exploiting State Encoding for Invariant Generation in Induction-based Property Checking"; IEEE; Department of Electrical and Computer Engineering; University of Kaiserslautern; Kaiserlautern, Germany; 2004; pp. 424-429.

Jiang, et al; "Inductive Equivalence Checking under Retiming ad Resynthesis"; IEEE;Department of Electrical Engineering/Graduate Institute of Electronics Engineering; National Taiwan University; Taipei, Taiwan; 2007; pp. 326-333.

Baumgartner, et al; "Scalable Sequential Equivalence Checking across Arbitrary Design Transformation"; IEEE; 2006.

Zheng, et al; "An Efficient Sequential Equivalence Checking Framework Using Boolean Satisfiability"; IEEE; Institute of VLSI Design, Zhejiang University, Hangzhou, China; 2007; pp. 1174-1177.

* cited by examiner

TECHNIQUES FOR PERFORMING CONDITIONAL SEQUENTIAL EQUIVALENCE CHECKING OF AN INTEGRATED CIRCUIT LOGIC DESIGN

BACKGROUND

1. Field

This disclosure relates generally to integrated circuit logic design and, more specifically, to techniques for performing conditional sequential equivalence checking of an integrated circuit logic design.

2. Related Art

In general, formal verification involves rigorously proving that an integrated circuit (IC) logic design (design) satisfies an associated specification. Typically, the specification of a verification problem includes a netlist representation of a design and a set of expected values for specified nets of the netlist. A 'netlist' comprises gates of various functions (which evaluate to Boolean values over time) and edges (which represent interconnections between the gates). A 'trace' may be a sequence of binary (i.e., '0' or '1') values to gates over time or a sequence of ternary values (i.e., '0', '1', or 'X', where value 'X' refers to an unknown value) to gates over time.

A gate may, for example, fall into one of four broad functional categories: constant gates, random gates, combinational gates, and state elements (e.g., registers and sequential gates, such as latches and flip-flops). A constant gate produces a logic level that does not vary with time. A random gate (also referred to as a primary input) may assume any logic level in any time-step independent of all other gates. A combinational gate is a logical element such as an AND gate, an OR gate, a NAND gate, a NOR gate, etc. A sequential gate has an associated initial value function and a next state function. The value of a sequential gate at time '0' (t0) is the value of the initial value function. The value of a sequential gate at time 'i+1' is equal to the value of the next state function of the sequential gate at time 'i'.

As an example, a verification problem may include determining whether a state exists in which a particular signal is asserted, where assertion of the particular signal indicates a fault. Using formal verification, an attempt is made to find a counter-example trace that includes a sequence of net values over time (states) that leads to an assertion of a particular signal or prove that no counter-example trace exists that leads to the assertion of the particular signal. Formal verification is often performed using state space search algorithms, which include unbounded and bounded exhaustive search algorithms. Bounded exhaustive search algorithms attempt to find an assertion of a particular signal that occurs within 'N' time-steps from an initial state of a design. Unbounded exhaustive search algorithms increase 'N' until no states are encountered that have not already been encountered for smaller values of 'N' (a condition referred to as a 'fixed-point'). If no path from an initial state to a violating state (i.e., a state in which the particular signal is asserted) is encountered before the fixed-point is reached, then correctness of a design can be inferred.

The number of verification cycles required to perform an exhaustive state space search increases exponentially with the number of state elements (e.g., registers, latches, flip-flops, etc.). This exponential relationship makes formal verification impractical for designs containing a large number of state elements (e.g., one-hundred or more state elements). As a result, semi-formal verification has been employed as a verification technique for large designs. Semi-formal verification leverages formal algorithms by applying the formal algorithms to larger designs in a resource-bounded manner. While requiring less computation time (as compared to formal verification), semi-formal verification may only achieve partial verification coverage.

SUMMARY

According to one aspect of the present disclosure, a technique for conditional sequential equivalence checking of logic designs embodied in netlists includes creating an equivalence-checking netlist over a first netlist and a second netlist. The conditional sequential equivalence checking includes conditions under which equivalences of the first and second netlists are checked. In this case, the first netlist is associated with a first logic design and the second netlist is associated with a second logic design. The technique derives a set of candidate conditional equivalence invariants for each correlated gate in a correlated gate pair set and attempts to prove that each candidate conditional equivalence invariant in the set of candidate conditional equivalence invariants is accurate. The candidate conditional equivalence invariants that cannot be proven accurate are removed from the set of candidate conditional equivalence invariants. The candidate conditional equivalence invariants that have been proven accurate are recorded as a set of conditional equivalence invariants. Finally, the conditional sequential equivalence checking of the equivalence-checking netlist is completed using the set of conditional equivalence invariants that are recorded.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
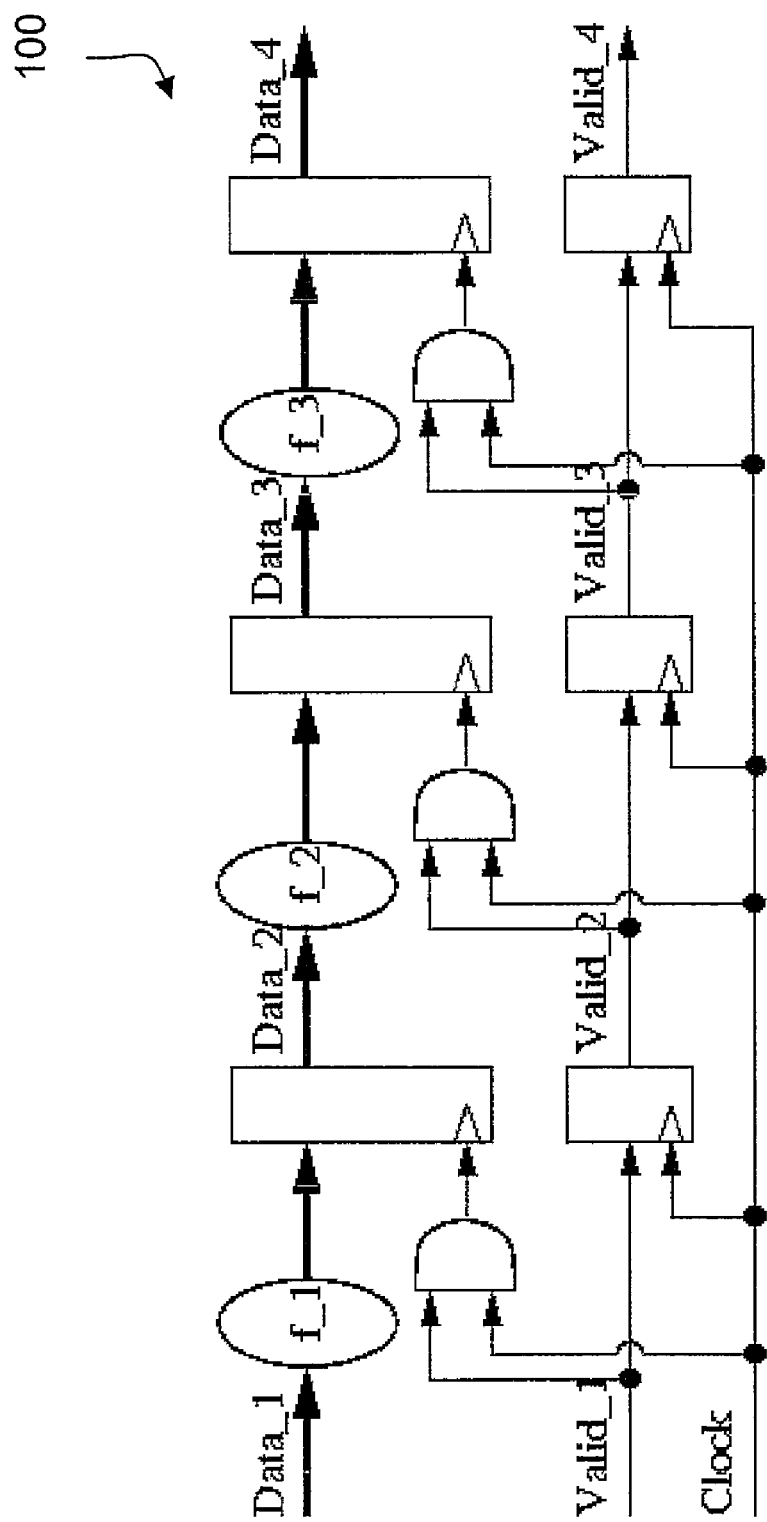
FIG. 1 depicts an integrated circuit logic design (design) comprising a unit which pipelines data computation across three clock periods.

As will be appreciated by one of ordinary skill in the art, the present invention may be embodied as a method, system, or computer program product. Accordingly, the present invention may take the form of an entirely hardware embodiment, an entirely software embodiment (including firmware, resident software, microcode, etc.), or an embodiment combining software and hardware aspects that may all generally be referred to herein as a "circuit," "module," or "system." Furthermore, the present invention may take the form of a computer program product on a computer-usable storage medium having computer-usable program code embodied in the medium.

Any combination of one or more computer usable or computer readable storage medium(s) may be utilized. The computer-usable or computer-readable storage medium may be, for example, but is not limited to, an electronic, magnetic, optical, electromagnetic, infrared, or semiconductor system, apparatus, or device. More specific examples (a non-exhaustive list) of the computer-readable storage medium includes: a portable computer diskette, a hard disk, a random access memory (RAM), a read-only memory (ROM), an erasable programmable read-only memory (EPROM) or Flash memory, a portable compact disc read-only memory (CD-ROM), an optical storage device, or a magnetic storage device. It should be noted that the computer-usable or computer-readable storage medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this disclosure, a computer-usable or computer-readable storage medium may be any medium that can contain or store the program for use by or in connection with an instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in an object oriented programming language, such as Java, Smalltalk, C++, etc. However, the computer program code for carrying out operations of the present invention may also be written in conventional procedural programming languages, such as the "C" programming language or similar programming languages.

The present invention is described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operations to be performed on the computer or other programmable apparatus to produce a computer implemented process such that the instructions which execute on the computer or other programmable apparatus implement the functions/acts specified in the flowchart and/or block diagram block or blocks. As may be used herein, the term "coupled" includes both a direct electrical connection between blocks or components and an indirect electrical connection between blocks or components achieved using one or more intervening blocks or components.

The techniques disclosed herein are effective at verifying that clock-gating and power-gating optimizations do not inadvertently alter integrated circuit logic design (design) behavior. More broadly, the techniques disclosed herein are applicable to arbitrary cases where sequential observability don't care (ODC) conditions are used to optimize portions of a design.

Sequential equivalence checking (SEC) technologies that are capable of demonstrating behavioral equivalence of two designs have grown dramatically in capacity over the past decades. The ability to efficiently identify and leverage internal equivalence points to reduce a domain of an overall SEC problem is central to scalability. However, conditionally equivalent designs, within which internal equivalence may not exist under sequential observability don't care (ODC) conditions, are notoriously difficult for known automated SEC tools. According to various embodiments of the present disclosure, techniques are disclosed that advance the scalability of SEC for conditionally equivalent designs through automated invariant generation. The techniques disclosed herein facilitate inductive solutions to otherwise highly non-inductive problems. The disclosed techniques may be advantageously employed to solve a variety of complex SEC problems, including SEC problems with globally optimal clock gating and power gating.

Equivalence checking refers to the process of demonstrating the behavioral input-to-output equivalence of two designs. Numerous equivalence checking paradigms exist in practice. Combinational equivalence checking (CEC) is a framework where the state elements of two designs have a 1:1 correlation. Instead of directly checking input-to-output equivalence, CEC frameworks usually assume that correlated state elements are equivalent, and demonstrate that outputs (as well as next-state functions of the correlated state elements) are equivalent. In this manner, CEC frameworks avoid computationally expensive sequential reasoning by decomposing an overall equivalence check into a set of combinational proof obligations.

SEC is a generalization of CEC in which designs being equivalence checked may not have a 1:1 state element correlation. In general, if a sequential transformation is performed across designs being equivalence checked, CEC is no longer directly applicable (at least, not without substantial manual or restrictive methodological guidance). Sequential transformations (e.g., retiming, state re-encoding, unreachable-state based optimizations, etc.) are commonly used in the design of high-performance circuits. Due to its generality, SEC generally requires analysis of the sequential behavior of the designs being equivalence checked (and, as such, comes with substantially greater computational expense).

Verification constraints (constraints) are constructs that may be employed in design verification applications. A constraint may be implemented as a specially-labeled gate (i.e., a constraint gate) in a netlist of a design. In general, a constraint represents a limitation on the freedom of a verification tool to explore a state space of a design. For example, a constraint may prevent a verification application from exploring any 'j' time-step trace in which any of one or more constraints evaluate to a logical zero during any of the 'j' time steps. Typically, a constraint defines a portion of a state space of a design that is irrelevant for verification purposes and, as such, would unnecessarily consume verification resources if the constraint were verified. As one example of a constraint, 'a design may be constrained to prevent new transfers of data when a buffer is full'. In general, constraining inputs of the design to prohibit data transfers when the buffer is full means that a verification tool does not cover states that represent the design accepting new data transfers when the buffer is full.

In the absence of a constraint, a typical verification problem is stated as, for example, find a 'j' step trace that exhibits a violation of a property or prove that no such trace exists for any 'j'. With a constraint, the same verification problem may be expressed as, for example, find a 'j' step trace that exhibits a violation of a property and does not exhibit a logical zero value for any constraint in any of the 'j' steps, or prove that no such trace exists for any 'j'. Because constraints alter the semantics of a verification problem, constraints have the potential to cause a property that could be reached by a design to become unreachable. As such, it is desirable to select constraints judiciously. In general, constraints should not alter semantics of a verification problem. A constraint, for example, that would prevent a verification tool from discovering a valid assertion of a signal should not be permitted. Because constraints prohibit the exploration of certain otherwise reachable states, redundancy removal algorithms may leverage constraints to enable greater gate merging. In particular, redundancy removal algorithms may merge gates that are equivalent in all states reachable along paths that do not violate any constraints, even if the merged gates are not equivalent in some states that are reachable only after violating a constraint.

A cutpoint gate may be introduced (into a modified netlist) by replacing a sequential gate in an original netlist with a random gate. An output of a random gate drives the same inputs in the modified netlist as an associated sequential gate drove in an original netlist. Unlike the inputs of the sequential gate in the original netlist, however, the inputs of the random gate are random inputs that are not connected to any other elements of the modified netlist. Inputs to a random gate can assume any value on any gate cycle irrespective of other stimulus applied to a design. As such, the net effect of introducing cutpoints into a netlist may be to over-approximate the behavior of a design, as a random gate can simulate behavior of the sequential gate, while the converse is not necessarily true. As an over-approximate model of an original netlist, a modified netlist may include states from which a target gate could not be asserted in the original netlist.

Retiming techniques, which were originally developed for enhanced synthesis, have more recently been proposed to enhance verification (i.e., reduce verification time) through reduction in latch (flip-flop) count. Generally speaking, retiming refers to the process of moving latches across combinational gates. In general, many prior art retiming algorithms have shifted every gate in a design under verification by an arbitrary amount, which may pose challenges to the use of retiming in a verification setting under the presence of constraints.

The ability to leverage internal equivalence points is often critical to the scalability of SEC. As with CEC, instead of merely demonstrating input-to-output equivalence, a set of internal equivalences may be demonstrated in conjunction. This overall set of properties is often substantially easier to solve than direct input-to-output equivalence. Invariants that stipulate internal equivalences often enhance inductivity by strengthening the collective induction hypothesis. However, unlike CEC, it is generally not the case that every state element constitutes an internal equivalence point. For example, two designs may not have a 1:1 correlation of state elements or behavioral equivalence among state elements that appear correlated (e.g., designs that have identical signal names in their respective hardware description language (HDL) definitions).

Figure 2:
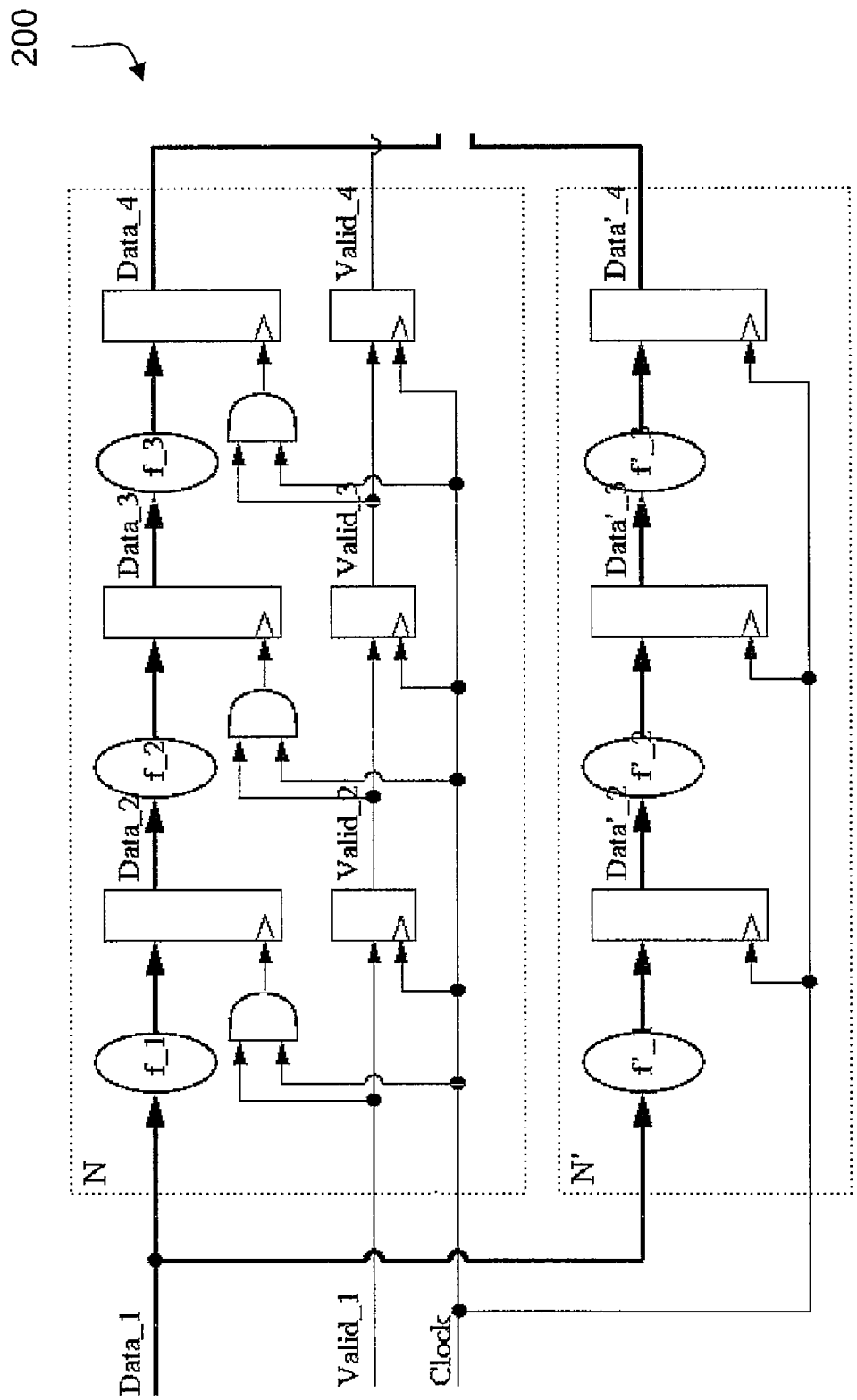
FIG. 2 depicts a design that is equivalent to the design in FIG. 1 and a design that is a simplified version of the design in FIG. 1 that does not employ clock gating.

The present disclosure addresses a generalization of SEC known as conditional sequential equivalence checking (CSEC). Unlike the above-mentioned SEC paradigm, where equivalence is checked at all points in time and across all execution sequences, CSEC allows designs to depart from equivalent behavior under specific time-frames. With reference to FIG. 1, a diagram 100 depicts a logic design that includes a unit that pipelines data computation across three clock periods. When a given pipeline stage is not required to produce a valid result, a clock may be disabled to reduce power consumption using a low-power technique known as clock gating. With reference to FIG. 2, it is often desirable to validate that a version of a design with clock gating disabled (or not integrated) produces equivalent results to a version of the design with clock gating enabled (to ensure that the added clock gating does not inadvertently alter design behavior). In FIG. 2, a diagram 200 depicts a design N that is equivalent to the design depicted in the diagram 100 of FIG. 1 and a design N' that is a simplified version of the design N without clock gating. It should be appreciated that the above-described problem is a CSEC problem (i.e., when no valid instruction is being processed (Valid_i=0) and the design N holds the results of its last computation. In contrast, the design N' needlessly processes whatever invalid data is present at its inputs). In this case, the equivalence check over outputs Data_4 and Data'_4 should be restricted to cases where a valid output is required from N.

Power gating is another CSEC problem domain in which a voltage supply of a design component may be disabled by a controller when the component is idle. In this case, power is only restored to the component when that controller detects an imminent processing need. Power-disabling is often modeled in verification by randomizing or 'tristating' state element contents, when a voltage supply for the state element is disabled.

CSEC problems are notoriously difficult to solve, since CSEC problems lack the internal equivalences which are key to the scalability of traditional SEC approaches. While internal equivalences no longer unconditionally hold in CSEC problems, it is often the case for correct designs that internal equivalences hold conditionally. For example, in FIG. 2, when Valid_i=1, the state elements of Data_i and Data'_i are pairwise equivalent. Conversely, the only time-frames at which corresponding state elements are inequivalent is during an ODC condition, which may never propagate to the outputs of the design at relevant time-frames. Given an adequate set of conditional equivalence invariants, it is often the case that a CSEC problem becomes k-inductive. As noted below, k-induction is a proof framework that attempts to demonstrate that no state (reachable or not) which cannot violate a property within 'k' time-frames may do so in greater than 'k' time-frames. The fact that certain CSEC problems become k-inductive facilitates derivation of an adequate set of invariants to (in turn) enable an efficient automated CSEC solution. In general, one may assume a synthesis-unaware paradigm for maximal applicability and generality (e.g., in case such optimizations are performed manually). In various cases, synthesis-history hints are not required to implement the techniques disclosed herein.

The techniques disclosed herein are applicable to an equivalence check between two logic designs that are represented as netlists. Often gates are analyzed using binary analysis where every gate takes '0' or '1' values over time. Alternatively, ternary analysis, where every gate takes on '0', '1', or 'X' values over time, may be employed. In this case, 'X' values represent either '0' or '1'. For example, for a 2-input AND gate, if either input of the AND gate evaluates to '0', the output of the AND gate is '0' regardless of the value of the other gate due to well-known logical properties. However, if none of the inputs evaluate to '0' and at least one of the inputs evaluates to 'X', the output evaluates to 'X' since, depending on whether the input X refers to '0' or '1', the output may either be '0' or '1'. A gate whose output takes value 'X' is considered to be tristated.

In an equivalence checking framework, random gates are frequently correlated to ensure that netlists are checked for equivalence across identical execution sequences. Also, one often correlates a set of internal or output gates, such that the goal of the equivalence check is to demonstrate equivalence with respect to values appearing on these correlated internal or output gates. In a CSEC framework, an 'equivalence condition' gate may be specified to indicate when correlated internal or output gates are to be checked. In particular, correlated outputs are checked for equivalence when the equivalence condition gate evaluates to '1'. For example, in FIG. 2, outputs Data_4 and Data'_4 are checked for equivalence under equivalence condition Valid_4.

An invariant is a property of a netlist that holds in all reachable states. An invariant may be represented through an added gate that always evaluates to '1'. While a functionally redundant characterization of netlist behavior, an invariant may be used to tighten the degree of over-approximation of certain verification techniques to enable a more efficient proof. For example, k-induction is a proof framework that attempts to demonstrate that no state (reachable or not) which cannot violate a property within 'k' time-frames may do so in greater than 'k' time-frames. The over-approximation inherent in induction is that if the particular check fails, one generally cannot determine whether the failing 'inductive state' is actually reachable or not. Similarly, interpolation is a framework that over-approximates the reachable-state analysis of a netlist, risking the appearance that some property-violating unreachable states are actually reachable. Invariants may be used to enhance frameworks because they constrain the over-approximation toward the true netlist behavior.

According to the present disclosure, a framework for invariant generation tuned for enabling complex CSEC problems to be efficiently solved using over-approximating proof techniques (such as induction and interpolation) is disclosed. In particular, given an equivalence checking netlist, the techniques attempt to derive a set of conditional equivalence invariants of the form if (g_i=1) then (m_i=m'_i), where m_i and m'_i are correlated gates from netlists N and N' respectively being equivalence checked. We refer to the set of candidate gates g_i for which a particular (m_i=m'_i) equivalence holds as the equivalence conditions of m_i or m'_i denoted E(m_i) or E(m'_i). The set of correlated gate pairs (m_i, m'_i) are denoted as set M". According to one aspect of the present disclosure, an invariant-based CSEC solution framework may be implemented as follows:
1. Create an equivalence-checking netlist over N and N';
2. Derive a set of candidate conditional equivalence invariants E(m_i) for each (m_i, m'_i) in M";
3. Optionally, utilize under-approximate analysis to falsify invalid invariants and prune E;
4. Attempt to prove that each of the candidate invariants is accurate;
5. If any invariants cannot be proven, prune the unproven invariants from E and go to 4;
6. For all invariants that have been proven accurate, record the resulting E; and
7. Solve the overall CSEC problem using the recorded E.

With reference to line 2, the invariant-based CSEC solution framework first uses any variety of techniques to stipulate candidate conditional equivalence invariants. With reference to line 3, any variety of falsification techniques may be employed to eliminate incorrect candidates. For example, random simulation, a hardware accelerator, or formal/semi-formal search techniques (which may use a Boolean satisfiability (SAT) solver or a binary decision diagram (BDD)) may be employed to falsify invalid invariants. Moving to line 4, an arbitrary set of verification algorithms may be employed to prove the remaining candidates. If any candidate invariants cannot be proven, due to being incorrect or due to being computationally intractable, the candidate invariants that cannot be proven are eliminated and another proof is attempted over the candidate invariants that remain (see line 5). For example, iterating the check until all candidates are proven together cross-leverages each invariant to tighten any over-approximate analysis used to prove the other invariants (e.g., to strengthen a collective induction hypothesis). Moreover, any invalid candidates may jeopardize the soundness of other proof results in the framework. Once all candidates are proven correct in line 6, the resulting invariant set is recorded and can be used as the basis of a CSEC proof in line 7. It should be noted that there are other application domains where such invariants may be useful. For example, conditional equivalence invariants may offer insight on possible design optimizations.

It is occasionally useful to reason about a netlist using ternary modeling where gates may take values '0', '1', or 'X'. For example, in power gated designs, a register whose voltage is disabled may be modeled as having a ternary 'X' value. Additionally, ternary 'X' may represent conditions such as an undriven bus, an undefined 'case statement' condition, or other ODC conditions. It may often be the case that when a given (m_i, m'_i) in M" is not tristated, associated gates will be equivalent across the two designs. Furthermore, often only a subset of the gates in a design may be tristated. In various cases, a ternary-valued invariant generation framework may be implemented as follows:
1. Create a ternary-valued equivalence-checking netlist over N and N';
2. Derive a set of candidate invariants E (m_i) for each (m_i, m'_i) in M" of the form: "NOT TRISTATED(m_i) IMPLIES (m_i=m'_i)", "NOT TRISTATED(m'_i) IMPLIES (m_i=m'_i)", "NOT TRISTATED(m_i)", "NOT TRISTATED(m'_i)";
3. Optionally utilize under-approximate analysis to falsify invalid invariants and prune E;
4. Attempt to prove that each of the candidate invariants is accurate;
5. If any invariants cannot be proven, prune the unproven invariants from E and go to 4;
6. For all invariants that have been proven accurate, record the resulting E; and
7. Solve the overall CSEC problem using the recorded E.

In other cases, one often may meaningfully subset the set of candidates on a per correlated-gate basis using a variety of heuristics, which are applicable on a per-problem basis. It should be appreciated that considering every gate in a netlist as a condition candidate thereof may require the consideration of a quadratic number of candidate invariants with respect to netlist size, motivating techniques to subset the candidates while still retaining an adequate subset to ensure an efficient overall CSEC solution.

For some designs, a set of candidates may be meaningfully subsetted by analyzing a sequential behavior of a netlist. For example, considering the pipelined example of FIG. 1, intuitively the logic comprising pipeline stage 'i' would not constitute useful conditions for pipeline stages 'j' which differ from 'i'. For general cyclic sequential netlists, the question of which gates may be effective conditions for which correlated-gate pairs becomes complex, due to the inability to meaningfully structurally associate 'pipeline stages'. According to the present disclose, one solution to determining which gates may be effective conditions for which correlated-gate pairs is to analyze toggle and mismatch activities of equivalence condition candidates and correlated-gate pairs. For example, a toggle-based invariant generation framework may be implemented as follows:

1. for (i=0; NOT terminate; i++)//iterate over time 'i';
2. C_i=set of gates which may toggle at time 'i';
3. M_i=gate pairs from M" which may mismatch (or toggle from a mismatch to a match) at time 'i';
4. Enumerate "C_i" as equivalence condition candidates for M_i in E;
5. Validate E at time 'i';
6. Attempt to prove that each of the candidate invariants is accurate;
7. If any invariants cannot be proven, prune the unproven invariants from E and go to 4;
8. For all invariants that have been proven accurate, record the resulting E; and
9. Solve the overall CSEC problem using the recorded E.

For certain types of designs, e.g., pipelines such as the pipeline shown in FIG. 1, merely checking which gates may first toggle to a particular value at time 'i' (set C_i), and associating them as candidate equivalence conditions for correlated-gate pairs which may first mismatch at time 'i' (set M_i) is usually effective. In other cases (e.g., power-gated designs), when correlated-gate pairs first transition from inequivalent to equivalent may be more important than when the correlated-gate pairs first mismatch. Until a gate toggles for the first time, the gate is effectively constant and, as such, is not usually useful to use as an equivalence condition for any correlated-gate pair. Similarly, until a pair of correlated gates mismatch for the first time, there is no need to attempt to learn invariants over them as doing so entails an unconditional equivalence invariant.

In other cases, one may meaningfully subset the set of candidate invariants through structural analysis. For example, one may only consider gates with substantial fan-in overlap between a correlated-gate pair as equivalence condition candidates. Using fan-in overlap often works well for clock-gating and power-gating verification, as the equivalence condition for a given state-element pair is often directly used to clock one of the two state elements. However, for more general sequential ODC-based optimizations, structural prunings may fail to capture adequate conditions which may only be present in logic which flows around the redesigned subcircuits and/or be present at an equivalence checking testbench level alone. An equivalence checking testbench comprises a netlist N" which is the composition of two netlists N and N' under bijective mapping I↔I', along with possibly additional testbench logic; bijective mappings O↔O' and M↔M'; and an equivalence condition mapping C":O↔V". The composition of N and N' is such that correlated elements of I and I' become merged as a single primary input. Mapping C" defines the equivalence checking objectives for the testbench, i.e., a property (C"(o)↔(o≡o')) to check of each correlated output pair (o, o') of (O, O').

As used herein testbench logic refers to gates introduced to a netlist solely for verification purposes. In applicable cases, structural pruning may dramatically improve runtime by either limiting equivalence condition candidates to overlap with the fan-in cone of the correlated-gate pair or by limiting conditions to gates in testbench logic. For example, a structure-based candidate invariant generation framework may be implemented as follows:

1. for (i=0; NOT terminate; i++)//iterate over time 'i';
2. M_i=gate pairs from M" which may mismatch (or toggle from a mismatch to a match) at time 'i';
3. C_i=gates which adhere to defined structural criteria;
4. Enumerate "C_i" as equivalence condition candidates for M_i in E;
5. Validate E at time 'i';
6. Attempt to prove that each of the candidate invariants is accurate;
7. If any invariants cannot be proven, prune the unproven invariants from E and go to 6;
8. For all invariants that have been proven accurate, record the resulting E; and
9. Solve the overall CSEC problem using the recorded E.

An additional technique to subset the set of candidate invariants is through semantic analysis, to losslessly eliminate only those candidates that are redundant given others, or to lossily eliminate those whose "constraining power" is less than the others. For example, transitive reductions may be used to reduce the number of implication-based invariants with no loss in their semantic power. Just as invariant (a IMPLIES b) and (b IMPLIES c) subsume in variant (a IMPLIES c), similar subsumption rules may be applied for conditional equivalence invariants. For example, if (a IMPLIES b), then (a IMPLIES (m_i=m'_i)) subsumes (b IMPLIES (m_i=m'_i)). Additionally, one may attempt lossy candidate invariant pruning using techniques such as ranking the relative constraining power of the candidates and retaining only a subset of greatest strength. Moreover, it is often the case that numerous equivalence pairs share the same equivalence condition, e.g. every state element in a given pipeline stage of FIG. 1 has the same 'Valid' bit as its equivalence condition. As such, it may prove more valuable to analyze a subset of equivalence pairs for valid equivalence conditions and then limit the candidate equivalence conditions of the remaining equivalence pairs to the subset. For example, a semantics-based invariant generation framework may be implemented as follows:

1. for (i=0; NOT terminate; i++)//iterate over time 'i';
2. Use arbitrary mechanism to add candidate equivalence conditions to equivalence pairs in M", adding to E;
3. Use a semantics-based technique to subset E;
4. Validate E at time 'i', thereby pruning E;
5. Augment any eliminated invariants from 4 using semantics-based techniques to add to E;
6. Attempt to prove that each of the candidate invariants is accurate;
7. If any invariants cannot be proven, prune the unproven invariants from E;
8. Augment any eliminated invariants from 4 using semantics-based techniques to add to E and go to 6;
9. For all invariants that have been proven accurate, record the resulting E; and
10. Solve the overall CSEC problem using the recorded E.

While the primary focus of this disclosure has been to establish invariants over correlated-gate pairs that are conditionally equivalent (as well as conditionally inequivalent), in practice netlists being equivalence checked may also contain a subset of correlated-gate pairs which are unconditionally equivalent. Such unconditional equivalence often must be considered to ensure inductiveness of the overall CSEC problem. Merely attempting to use traditional SEC algorithms to prove and then merge unconditionally-equivalent gates, prior to application of our CSEC invariant-generation framework, may partially capture the unconditional equivalences. However, this approach is often insufficient since the presence of the conditionally-equivalent gates, without their corresponding conditional-equivalence invariants, renders the proof of unconditional equivalence intractable.

An effective way to intermix the conditionally-equivalent and unconditionally-equivalent gate demonstration solutions is to nest the proposed conditional-equivalence invariant generation algorithm inside a traditional SEC framework using speculative reduction. Speculative reduction is a technique that is often used to speed the overall SEC process. Speculative reduction consists of merging fan-out references to suspected-equivalent gates even before they are proven equivalent, thereby simplifying proof goals expressed over the fan-out logic. To ensure soundness, the validity of the speculatively-merged gates is checked as a set of additional proof obligations, and the SEC process attempts to solve all proof goals in conjunction.

One may first postulate a set of candidate unconditional equivalences using a traditional SEC framework. Then, instead of directly proving the candidates, one may speculatively reduce the netlist such that fan-out references to the candidate unconditional equivalences reflect a merge, thereby simplifying the overall set of proof obligations (while retaining a proof obligation to validate that the speculative merge candidates truly are equivalent). A speculatively-reduced model may be used as the basis for the CSEC frameworks disclosed herein.

A comparable solution is to first generate candidate conditional-equivalence invariants, then to use a traditional SEC framework to prove those invariants in conjunction with any unconditional equivalences. However, the approach tends to be somewhat less efficient, as the CSEC framework needs to operate on a larger netlist that may require managing more semantically-equivalent invariants.

As illustrated in the above techniques, a basic flow is to first associate a set of candidate equivalence conditions with each gate pair in M", then employ under-approximate analysis techniques to eliminate many of the invalid candidates, and finally attempt to prove the remaining candidate invariants correct. In one or more embodiments, the candidate invariants are represented by a 'trie' data structure that stores sets of candidate equivalence conditions for each (m_i, m'_i) in M". The benefits of using a trie are that each unique equivalence condition set only requires a single data representation, and more importantly that common subsets of candidates across different correlation pairs may share in their data representation.

When one counter-example trace is obtained (using, for example, Boolean satisfiability (SAT)) which invalidates one candidate invariant, a tuned random simulation process may be employed to efficiently rule out large sets of invalid invariants. In particular, a bit-parallel simulator that models the behavior of a netlist across a variety of randomized input patterns (though seeded to be consistent with the behavior witnessed in the original counter-example) may be utilized. For example, by using 1024 parallel simulation patterns, witness ratios of 100:1 to 100000:1 in terms of the number of invalid candidates ruled out by re-simulation of SAT traces versus the number of satisfiable SAT calls themselves may be achieved. Overall, while in the worst case a quadratic number of candidates may need to be considered, through thoughtful engineering, memory overhead and runtime of the disclosed conditional equivalence invariant generation frameworks approach linearity.

Figure 3:
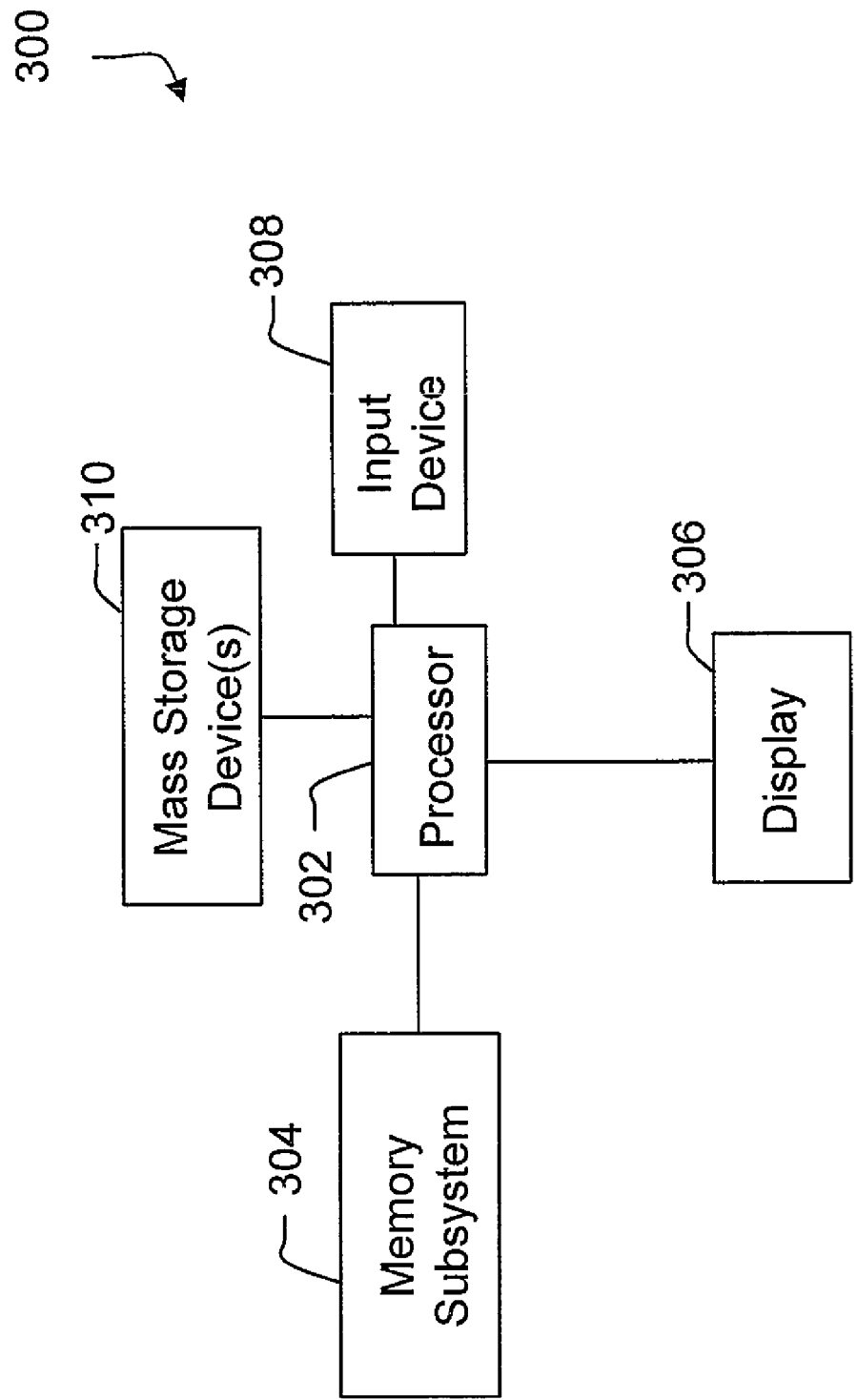
FIG. 3 is a diagram of an example computer system that may be employed to execute a tool configured according to the present disclosure.

With reference to FIG. 3, an example computer system 300 (which may be part of a high performance computing (HPC) cluster) is illustrated that may be configured to execute a tool that is configured to perform conditional sequential equivalence checking of an integrated circuit logic design (design) according to various embodiments of the present disclosure. The computer system 300 includes a processor 302 (which may include one or more cores) that is coupled to a memory subsystem 304, a display 306, an input device 308, and mass storage device(s) 310. The memory subsystem 304 includes an application appropriate amount of volatile memory (e.g., dynamic random access memory (DRAM)) and non-volatile memory (e.g., read-only memory (ROM)). The display 306 may be, for example, a cathode ray tube (CRT) or a liquid crystal display (LCD). The input device 308 may include, for example, a mouse and a keyboard. The mass storage device(s) 310 (which may include, for example, a compact disc read-only memory (CD-ROM) drive and/or a hard disk drive (HDD)) are configured to receive or include discs that store appropriate code (e.g., an operating system (OS), a verification tool including a retiming engine, etc.).

Figure 4:
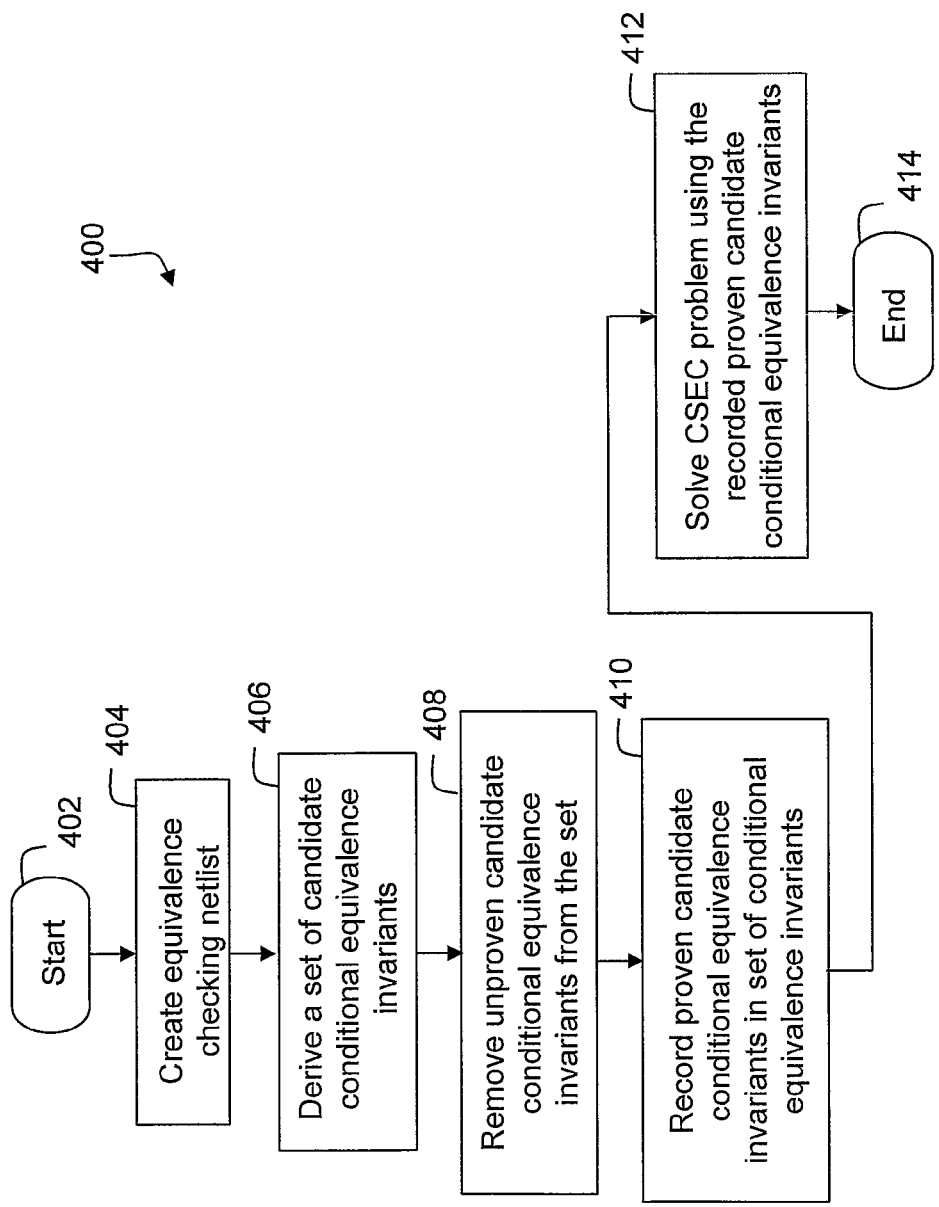
FIG. 4 is a flowchart of an example process for conditional sequential equivalence checking of a design, according to yet another embodiment of the present disclosure.

With reference to FIG. 4, a process 400 for conditional sequential equivalence checking of logic designs embodied in netlists is illustrated. The process 400 is initiated in block 402, at which point control transfers to block 404 where an equivalence-checking netlist is created over a first netlist and a second netlist. In this case, the first netlist is associated with a first logic design and the second netlist is associated with a second logic design. Next, in block 406, the process 400 derives a set of candidate conditional equivalence invariants for each correlated gate in a correlated gate pair set and attempts to prove that each candidate conditional equivalence invariant in the set of candidate conditional equivalence invariants is accurate. Then, in block 408, the candidate conditional equivalence invariants that cannot be proven accurate are removed from the set of candidate conditional equivalence invariants. Next, in block 410, the candidate conditional equivalence invariants that have been proven accurate are recorded as a set of conditional equivalence invariants. Then, in block 412, the conditional sequential equivalence checking problem is solved using the set of conditional equivalence invariants that are recorded. Following block 412, control transfers to block 414 where the process 400 terminates and control returns to a calling routine.

Accordingly, a number of techniques have been disclosed herein that generally reduce a runtime required to perform conditional sequential equivalence checking of logic designs embodied in netlists.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that, each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method for conditional sequential equivalence checking of logic designs embodied in netlists using a data processing system, comprising:
    creating, using the data processing system, an equivalence-checking netlist over a first netlist and a second netlist, wherein the first netlist is associated with a first logic design and the second netlist is associated with a second logic design, and wherein the conditional sequential equivalence checking includes conditions under which equivalences of the first and second netlists are checked;
    deriving, using the data processing system, a set of candidate conditional equivalence invariants for each correlated gate in a correlated gate pair set;
    attempting to prove, using the data processing system, that each candidate conditional equivalence invariant in the set of candidate conditional equivalence invariants is accurate;
    removing, using the data processing system, candidate conditional equivalence invariants that cannot be proven accurate from the set of candidate conditional equivalence invariants;
    recording, using the data processing system, the candidate conditional equivalence invariants that have been proven accurate as a set of conditional equivalence invariants; and
    completing, using the data processing system, the conditional sequential equivalence checking of the equivalence-checking netlist using the recorded set of conditional equivalence invariants.

2. The method of claim 1, wherein the removing employs under-approximate analysis to falsify invalid ones of the candidate conditional equivalence invariants.

3. The method of claim 2, wherein the removing employs random simulation, a hardware accelerator, or formal/semi-formal search techniques to falsify invalid ones of the candidate conditional equivalence invariants.

4. The method of claim 1, wherein the equivalence-checking netlist is binary valued.

5. The method of claim 1, wherein the equivalence-checking netlist is ternary valued.

6. The method of claim 1, further comprising:
    determining gates that are effective conditions for correlated-gate pairs based on toggle and mismatch activities of the candidate conditional equivalence invariants and the correlated-gate pairs.

7. The method of claim 1, further comprising:
    subsetting the set of candidate conditional equivalence invariants through structural analysis.

8. The method of claim 7, wherein the structural analysis is based on fan-in overlap between a correlated-gate pair.

9. The method of claim 1, further comprising:
    subsetting the set of candidate conditional equivalence invariants through semantic analysis.

10. A computer program product embodied on a computer readable storage device and including code for conditional sequential equivalence checking of logic designs embodied in netlists, the code, when executed, causing a data processing system to:
    create an equivalence-checking netlist over a first netlist and a second netlist, wherein the first netlist is associated with a first logic design and the second netlist is associated with a second logic design, and wherein the conditional sequential equivalence checking includes conditions under which equivalences of the first and second netlists are checked;
    derive a set of candidate conditional equivalence invariants for each correlated gate in a correlated gate pair set;
    attempt to prove that each candidate conditional equivalence invariant in the set of candidate conditional equivalence invariants is accurate;
    remove candidate conditional equivalence invariants that cannot be proven accurate from the set of candidate conditional equivalence invariants;
    record the candidate conditional equivalence invariants that have been proven accurate as a set of conditional equivalence invariants; and
    complete the conditional sequential equivalence checking of the equivalence-checking netlist using the recorded set of conditional equivalence invariants, wherein the equivalence-checking netlist is stored in the data processing system following the completion of the conditional sequential equivalence checking.

11. The computer program product of claim 10, wherein the removing employs under-approximate analysis to falsify invalid ones of the candidate conditional equivalence invariants.

12. The computer program product of claim 11, wherein the removing employs random simulation, a hardware accelerator, or formal/semi-formal search techniques to falsify invalid ones of the candidate conditional equivalence invariants.

13. The computer program product of claim 10, wherein the equivalence-checking netlist is binary valued.

14. The computer program product of claim 10, wherein the equivalence-checking netlist is ternary valued.

15. The computer program product of claim 10, wherein the code, when executed, is further configured to cause the data processing system to:

determine gates that are effective conditions for correlated-gate pairs based on toggle and mismatch activities of the candidate conditional equivalence invariants and the correlated-gate pairs.

16. The computer program product of claim 10, wherein the code, when executed, is further configured to cause the data processing system to:

subset the set of candidate conditional equivalence invariants through structural analysis.

17. The computer program product of claim 16, wherein the structural analysis is based on fan-in overlap between a correlated-gate pair.

18. The computer program product of claim 10, wherein the code, when executed, is further configured to cause the data processing system to:

subset the set of candidate conditional equivalence invariants through semantic analysis.

19. A data processing system configured to perform conditional sequential equivalence checking of logic designs embodied in netlists, the data processing system comprising:

a memory subsystem; and
one or more processors coupled to the memory subsystem, wherein the one or more processors are configured to:
create an equivalence-checking netlist over a first netlist and a second netlist, wherein the first netlist is associated with a first logic design and the second netlist is associated with a second logic design, and wherein the conditional sequential equivalence checking includes conditions under which equivalences of the first and second netlists are checked;
derive a set of candidate conditional equivalence invariants for each correlated gate in a correlated gate pair set;
attempt to prove that each candidate conditional equivalence invariant in the set of candidate conditional equivalence invariants is accurate;
remove candidate conditional equivalence invariants that cannot be proven accurate from the set of candidate conditional equivalence invariants;
record the candidate conditional equivalence invariants that have been proven accurate as a set of conditional equivalence invariants; and
complete the conditional sequential equivalence checking of the equivalence-checking netlist using the recorded set of conditional equivalence invariants, wherein the equivalence-checking netlist is stored in the data processing system following the completion of the conditional sequential equivalence checking.

20. The data processing system of claim 19, wherein the one or more processors are further configured to:

partition the set of candidate conditional equivalence invariants into subsets, wherein conditional equivalence is applicable between correlated gates in the first and second netlists when neither of the correlated gates in one of the subsets is tristated.

* * * * *